(12) United States Patent
Hasegawa

(10) Patent No.: US 6,586,293 B1
(45) Date of Patent: Jul. 1, 2003

(54) SEMICONDUCTOR DEVICE AND METHOD OF MANUFACTURING THE SAME

(75) Inventor: Eiji Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/760,774

(22) Filed: Jan. 17, 2001

(30) Foreign Application Priority Data

Jan. 17, 2000 (JP) .......................................... 2000-007449

(51) Int. Cl.⁷ .................. H01L 21/8238; H01L 21/302; H01L 21/461
(52) U.S. Cl. .................. 438/216; 438/723; 438/745; 438/756
(58) Field of Search .................. 438/216, 723, 438/745, 756, 751, 758, 770

(56) References Cited

FOREIGN PATENT DOCUMENTS

| JP | 60-9155 | 1/1985 |
|---|---|---|
| JP | 4-122063 | 4/1992 |
| JP | 05-29298 A | 2/1993 |
| JP | 6-77420 | 3/1994 |
| JP | 10-22397 | 1/1998 |
| JP | 10-163338 | 6/1998 |
| JP | 11-74508 A | 3/1999 |

*Primary Examiner*—Alexander Ghyka
(74) *Attorney, Agent, or Firm*—Sughrue Mion, PLLC

(57) ABSTRACT

To prevent a thick gate oxide film from being damaged by a cleaning and hydrofluoric-acid treatment preprocess performed prior to formation of a thin gate oxide film. A thick first gate oxide film is formed, and an insulating film, having etching resistance against the cleaning and hydrofluoric-acid treatment process for formation of thin second gate oxide film, is formed in an upper region of the first gate oxide film. A resist is then formed in a region where a thick gate insulating film is to be formed, and etching is performed on the first gate oxide film with the resist as a mask. The resist is stripped, then cleaning and hydrofluoric-acid treatment are performed on the silicon surface in a region where a thin gate insulating film is to be formed, and the thin second gate oxide film is formed.

19 Claims, 7 Drawing Sheets

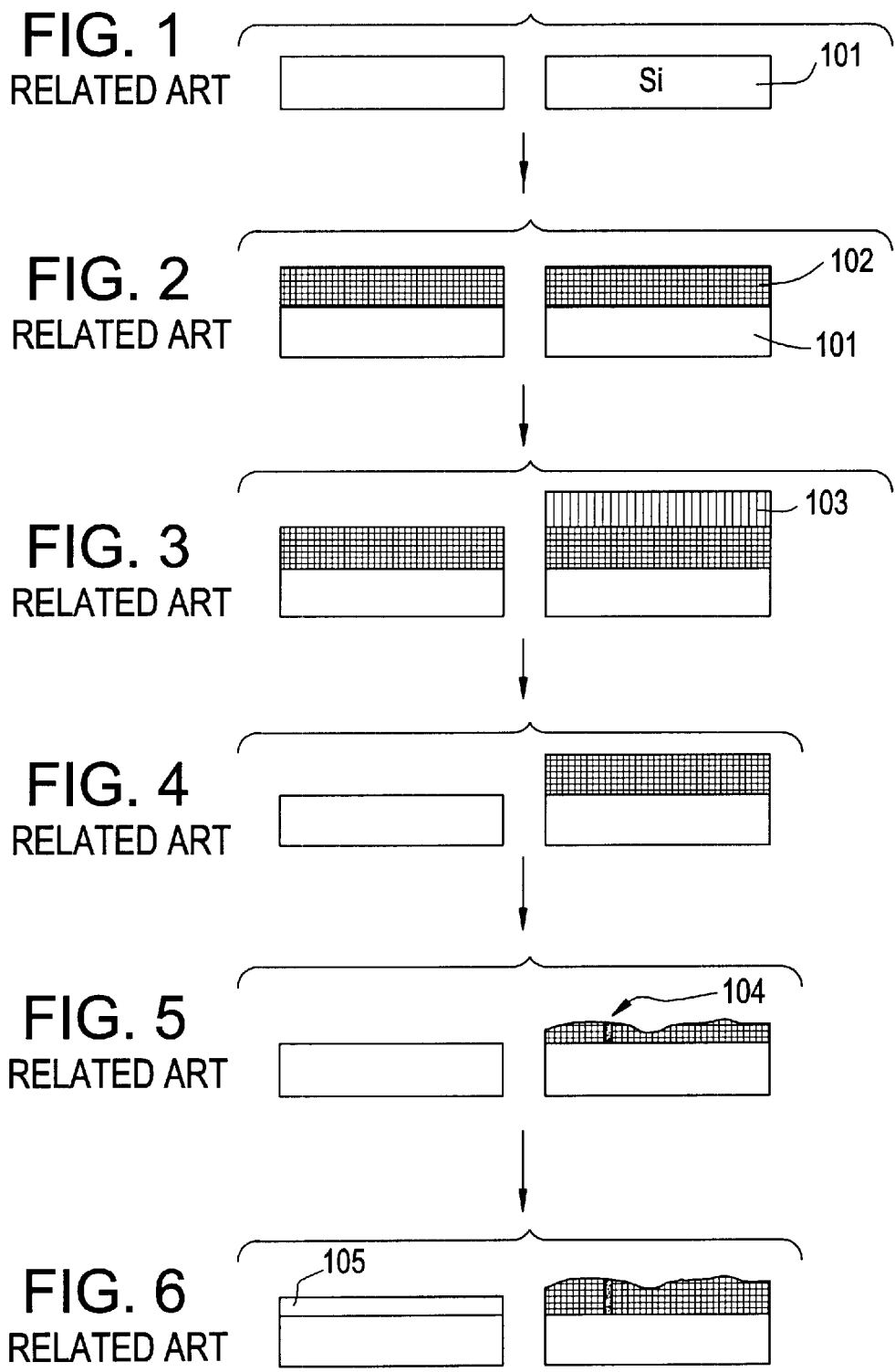

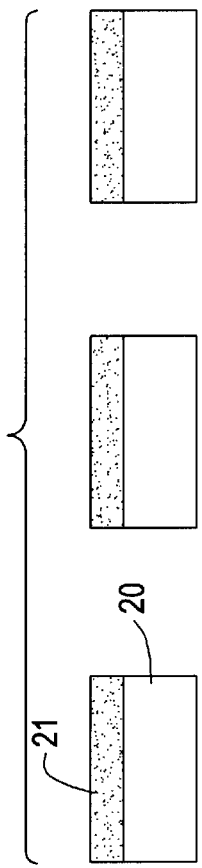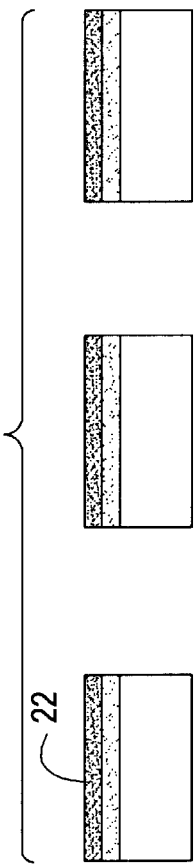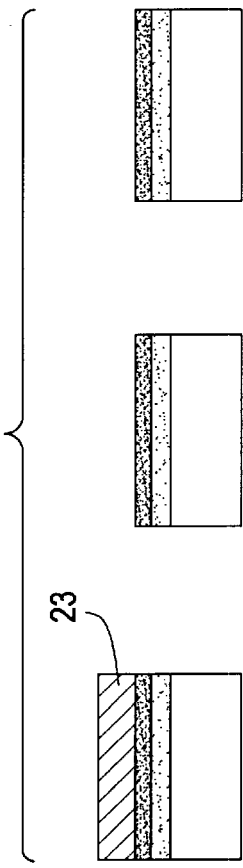

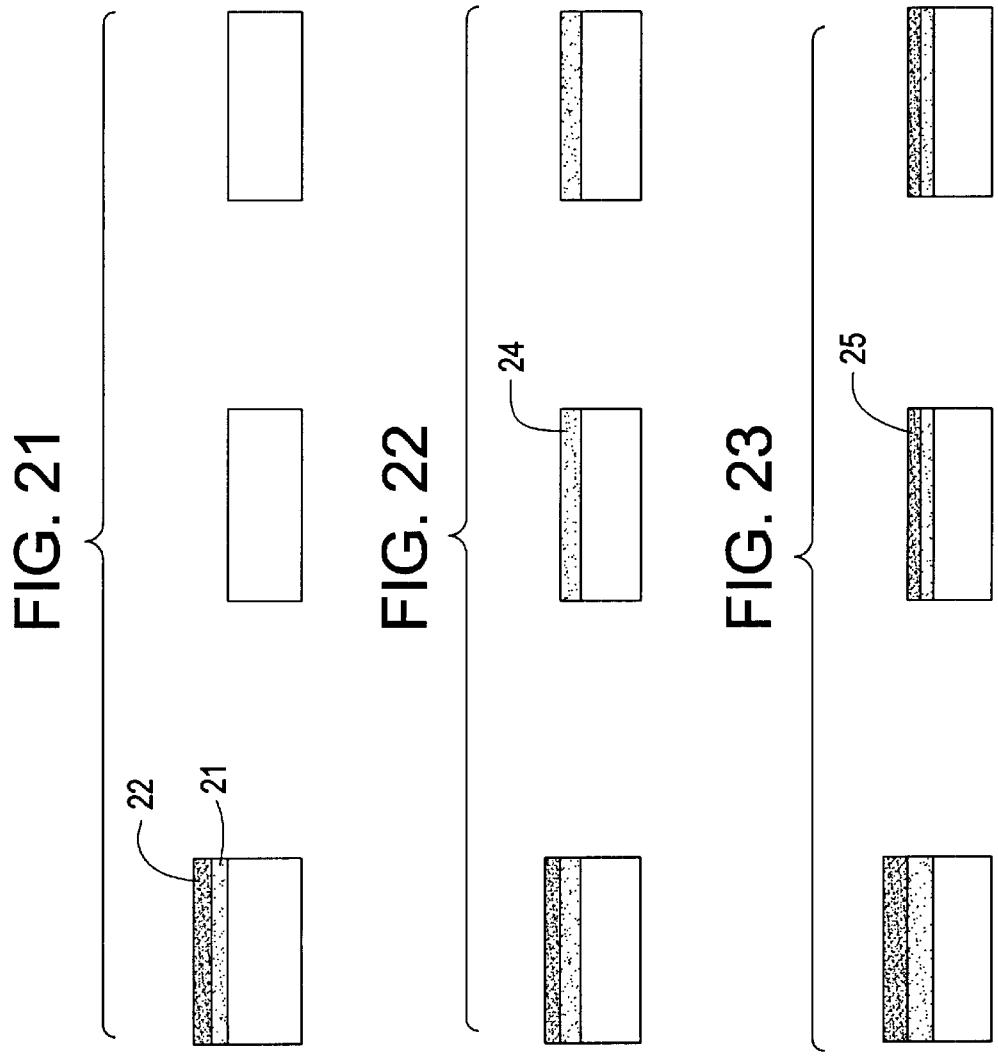

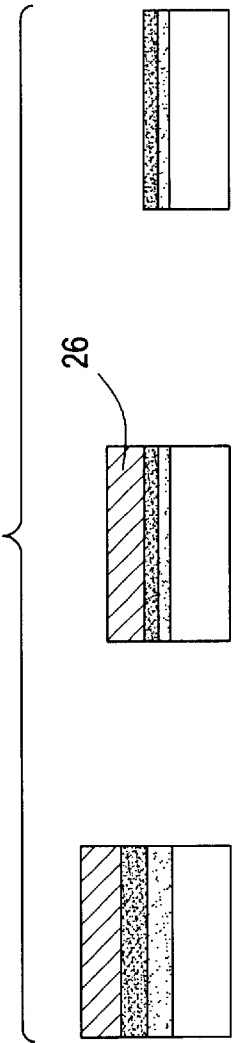
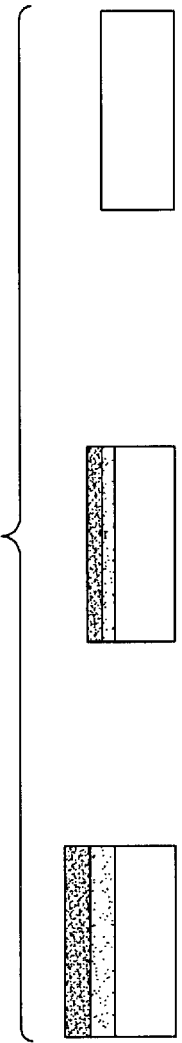
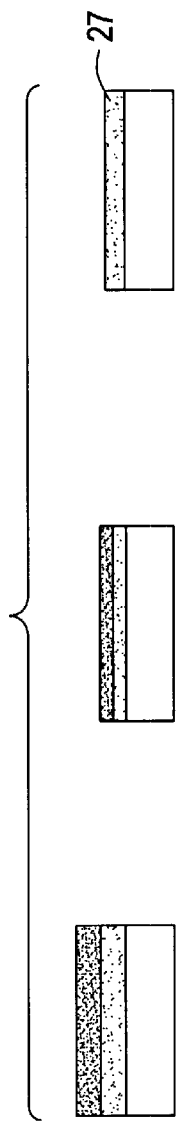

SEMICONDUCTOR DEVICE AND METHOD OF MANUFACTURING THE SAME

BACKGROUND OF THE INVENTION

1. Field of the Invention

The present invention relates to a semiconductor device having plural gate insulating films with different film thicknesses, from each other, and a manufacturing method therefor.

2. Description of the Related Art

In the prior art, a method of forming a multioxide device includes forming gate insulating films with different film thicknesses on the same chip. When transistors having different purposes are formed on the same chip, it is necessary to design respective parameters, such as the film thickness of gate oxide film, for each transistor to satisfy performance requirements for each transistor. For example, the film thickness of the gate oxide film must be reduced with reduction of power source voltage in a transistor required to operate at a high speed, while the film thickness of the gate oxide film must be increased with a requirement of comparatively high power source voltage in a transistor used for interface with the outside of the chip.

A prior art multioxide forming method will be described with reference to FIGS. 1 to 6. The left sides of FIGS. 1–6 show a region where a thin oxide film is formed, while the right sides of FIGS. 1–6 show a region where a thick oxide film is formed. First, as illustrated in FIG. 2, a first gate oxidation is performed to form the thick gate oxide film 102 on a silicon substrate 101. Then, as illustrated in FIG. 3, a resist 103 is formed at a right side region where the thick oxide film is to be formed. Then, as also illustrated in FIG. 3, etching is performed by using hydrofluoric-acid solution to remove the left side gate oxide film at a left side region where the thin oxide film is to be formed. Thereafter, the resist is stripped to produce the structure illustrated in FIG. 4. Preprocessing of cleaning and dilute hydrofluoric-acid (DIIF) treatment is then performed to produce the structure illustrated in FIG. 5 on the silicon surface at the left side region where the thin oxide film is to be formed after the left side gate oxide film has been etched. Then, the second gate oxidation is performed to form the thin gate oxide film 105 is formed at the left side region, as illustrated in FIG. 6.

In the resulting prior art structure, the thick oxide film which requires a clean state is contaminated with the resist 103 formed on it. However, since the thick oxide film is cleaned at the later cleaning process, and above all, the multioxide can be easily formed, the method is widely used.

Further, a second prior art method includes formation of multioxide by oxidation speed control by ion implantation. The multioxide formation method by ion-implantation forms gate oxide films with different film thicknesses by pattern forming a resist on a silicon substrate, selectively implanting ions for thermal oxidation speed control, and performing thermal oxidation after stripping the resist.

However, the second prior art method has various problems and disadvantages. For example, gate oxide film films with a large film thickness difference cannot be obtained. However, the second prior art method prevents contamination of gate oxide film by the resist coating, and the process steps can thus be reduced.

The prior art film thickness of multioxide has been further reduced as the micromininaturization and techniques for high-speed processing have further advanced. For example, the required film thickness of gate oxide film at a core region where high-speed processing is less than 2.0 nm. On the formation of a gate oxide film, it is necessary to clean the surface to eliminate contamination of the resist before forming the gate oxide film by thermal oxidation. The prior art gate oxidation is performed immediately after the cleaning, using any combination of aqueous ammonia hydrogen peroxide, aqueous hydrochloric acid hydrogen peroxide and aqueous sulfuric acid hydrogen peroxide.

However, when the gate oxide film is thinner than 2.0 nm, it is difficult to form the gate oxide film immediately after the cleaning, because the above-described cleaning forms an oxide film having a thickness of about 1.0 nm (i.e., a natural oxide film or chemical oxide film) on the silicon surface during the cleaning. Although the final film thickness of the gate oxide film is 2.0 nm or less, thermal oxidation is performed after the 1.0 nm natural oxide film is formed by cleaning, which means the half or more in thickness of the film that should have formed by the thermal oxidation is formed by the natural oxide film. This natural oxide film may significantly degrade the reliability of its insulation, because of the low density of the natural oxide. In addition, the condition of formation of the natural oxide film depends on cleaning conditions, and its film thickness is difficult to control. Variation in the final film thickness of the gate oxide film results. Therefore, when the gate oxide film having a film thickness of 2.0 nm or less is necessary, natural oxide film grown in the cleaning must be removed before forming a gate oxide film.

The gate oxidation after the removal of natural oxide film causes no problem upon formation of transistors having the same gate oxide films in their thicknesses. However, when multioxide is formed, a problem occurs in that the gate oxide film in a thick-film region in the multioxide is reduced with the natural oxide film formed at a thin-film formation region.

In the prior art, an oxide film is removed by a hydrofluoric-acid base chemical agent. Because the etching is performed for a while after the silicon substrate is exposed at the thin gate oxide film region to remove as much of the natural oxide film as possible, the etching also progresses in the oxide film at the thick gate oxide film region. Therefore, more of the gate oxide film at the thick gate oxide film region is etched than expected.

As a result, various problems and disadvantages result. For example, the reproducibility of film thickness at the thick film region is remarkably degraded when etching reproducibility is poor. Additionally, a conductive portion called a pin hole 104 forms in the oxide film, which degrades the insulation, since the hydrofluoric-acid solution selectively etches a weak portion of the thick-gate oxide film. While an oxide film appears to have uniform thickness and seems to be uniformly etched in its film thickness direction by etchant, the oxide film actually often has a nonuniform thickness at a microscopic level (e.g., in atomic order). Thus, the prior art oxide film has weak portions. Additionally, the hydrofluoric-acid solution selectively attacks the weak portions to overetch the films of those portions more than other (e.g., peripheral) portions. Therefore, the local thin film region is made in the thick film region. The pin hole 104 is an extreme example of an overetched portion, and the insulation is remarkably degraded at one portion, and the reliability in the insulation of the entire thick-film gate oxide film is thus degraded.

SUMMARY OF THE INVENTION

It is an object of the present invention to provide a semiconductor device, having a thick film region not damaged by the hydrofluoric-acid treatment, and a manufacturing method therefor predicated on hydrofluoric-acid treatment.

It is another object of the present invention to perform resist coating and selective etching in a region where a thin oxide film is to be formed, different from the multioxide formation method by ion-implantation.

A semiconductor device in an embodiment of the present invention comprising, a substrate that has a first region and a second region, a first film formed on said first region of said substrate and a second film formed on said second region of said substrate, wherein said second film is thinner than said first film, and said first film is resistant to etching during removal of a natural oxide.

To accomplish at least the above objects, a preferred embodiment provides a method of manufacturing a semiconductor device, comprising (a) forming a first film on a first region of a substrate and (b) forming a second film on a second region, wherein said first film is substantially resistant to etching, and a natural oxide film is removed from said second region before forming said second film on said second region.

A further preferred embodiment provides a method of manufacturing a semiconductor device, comprising (a) forming a first film on a first region of a substrate, (b) forming a second film on a second region, wherein said first film is substantially resistant to etching, and a natural oxide film is removed from said second region before forming said second film on said second region; and (c) forming a third film which is thinner than said second film on a third region of said substrate, wherein said third film is substantially resistant to etching a second natural oxide film on said third region of said substrate before forming said third film.

Another preferred embodiment provides method of manufacturing a semiconductor device, comprising (a) forming a first gate silicon oxide layer on said substrate in said first region and said second region, (b) forming a cover layer on said first gate silicon oxide film on said first region and said second region, and (c) forming a resist on said first film in said first region, and removing said first film from said second region by using said resist as a mask. The method also comprises d) forming a second film on a second region, (e) removing said first film from said second region, using said resist as a mask; and (f) removing said resist from said first region to form said first film in said first region. The method further comprises (g) removing contamination from said second region, said contamination being caused by said resist, wherein said natural oxide film is formed on said second portion at said removing contamination step and (h) removing said natural oxide film from said second region by using said first film as a mask for said first region, wherein said first film is substantially resistant to etching, and a natural oxide film is removed from said second region before forming said second film on said second region.

According to the embodiment of the present invention, the thick gate oxide film is not almost etched by the stripping process, the cleaning process and the hydrofluoric-acid treatment process performed at the thin gate oxide film region because the oxinitride film having higher etching resistance than the thin gate oxide film is formed on the surface of the thick gate oxide film. Thus precise film thickness control is realized.

BRIEF DESCRIPTION OF THE DRAWINGS

The above and other objects, advantages and features of the present invention will be more apparent from the following description taken in conjunction with the accompanying drawings, in which:

FIG. 1 is a cross-sectional diagram showing a structure formed in the steps of a prior art multioxide manufacturing method;

FIG. 2 is a cross-sectional diagram showing a structure formed in the steps of a prior art multioxide manufacturing method;

FIG. 3 is a cross-sectional diagram showing a structure formed in the steps of a prior art multioxide manufacturing method;

FIG. 4 is a cross-sectional diagram showing a structure formed in the steps of a prior art multioxide manufacturing method;

FIG. 5 is a cross-sectional diagram showing a structure formed in the steps of a prior art multioxide manufacturing method;

FIG. 6 is a cross-sectional diagram showing a structure formed in the steps of a prior art multioxide manufacturing method;

FIG. 18 is a cross-sectional diagram showing a structure formed in a steps of the multioxide manufacturing method according to a second preferred embodiment of the present invention;

FIG. 19 is a cross-sectional diagram showing a structure formed in a steps of the multioxide manufacturing method according to the second preferred embodiment of the present invention;

FIG. 20 is a cross-sectional diagram showing a structure formed in a steps of the multioxide manufacturing method according to the second preferred embodiment of the present invention;

FIG. 21 is a cross-sectional diagram showing a structure formed in a steps of the multioxide manufacturing method according to the second preferred embodiment of the present invention;

FIG. 22 is a cross-sectional diagram showing a structure formed in a steps of the multioxide manufacturing method according to the second preferred embodiment of the present invention;

FIG. 23 is a cross-sectional diagram showing a structure formed in a steps of the multioxide manufacturing method according to the second preferred embodiment of the present invention;

FIG. 24 is a cross-sectional diagram showing a structure formed in a steps of the multioxide manufacturing method according to the second preferred embodiment of the present invention;

FIG. 25 is a cross-sectional diagram showing a structure formed in a steps of the multioxide manufacturing method according to the second preferred embodiment of the present invention; and FIG. 26 is a cross-sectional diagram showing a structure formed in a steps of the multioxide manufacturing method according to the second preferred embodiment of the present invention.

BRIEF DESCRIPTION OF THE PREFERRED EMBODIMENTS

A semiconductor device using the device and manufacturing method according to the preferred embodiments of the present invention will be described with reference to the drawings. It is understood that the invention is not limited to these embodiments, which are provided as only examples of implementations of the invention. For example, the invention is not restricted to gate silicon oxide films, is applicable to other films having different thicknesses from each other.

FIGS. 7 to 17 illustrate cross-sectional views showing principal processes according to the first preferred embodiment of the present invention. Other manufacturing methods may be used and the invention is not limited to the manufacturing method described herein. In the first preferred embodiment, gate insulating films with different film thicknesses in adjacent devices in a MOS device will be described. However, the present invention is applicable to gate insulating films in respective regions which are not adjacent to each other.

The left halves of the figures correspond to a region where a thick gate insulating film is formed (hereinbelow referred to as a "thick film region"), and the right halves of the figures correspond to a region where a thin gate insulating film is formed (hereinbelow referred to as a "thin film region"). Generally, a thick gate insulating film is formed in a peripheral circuit portion, high voltage (e.g., 5 V, 3.3 V) and high power requiring portions and an input/output (I/O) portion, while a thin gate insulating film is formed in a core transistor portion, a low voltage (e.g., 12 V) requiring portions and a high-speed operation requiring portion.

Further, the first embodiment includes a device prepared for realizing the effect of the present invention, and process conditions are not limited to the main processes of the present invention.

Figure 7:
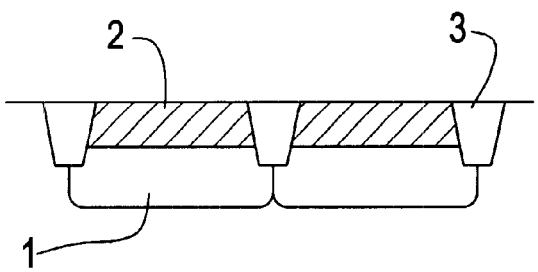
FIG. 7 is a cross-sectional diagram showing a structure formed in a steps of the multioxide manufacturing method according to a first preferred embodiment of the present invention.

First, as shown in FIG. 7, a device isolation region 3 is formed by the STI (Shallow Trench Isolation) method on a silicon substrate, then impurities are ion-implanted into respective regions to form a well 1 and a Vt control well 2.

Figure 8:
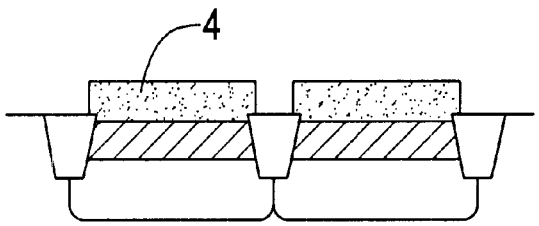
FIG. 8 is a cross-sectional diagram showing a structure formed in a steps of the multioxide manufacturing method according to the first preferred embodiment of the present invention.

Next, as shown in FIG. 8, after a cleaning process, a gate oxidation is performed to form a first gate oxide film 4 that is a thick gate oxide film. The cleaning is performed by using a mixed solution of aqueous ammonia, aqueous hydrogen peroxide and pure water, followed by a mixed solution of sulfuric acid and aqueous hydrogen peroxide. In the gate oxidation, for example the thick gate oxide film 4 having a thickness of about 5.5 nm may be formed by steam oxidation at about 750 to 850° C.

Figure 9:
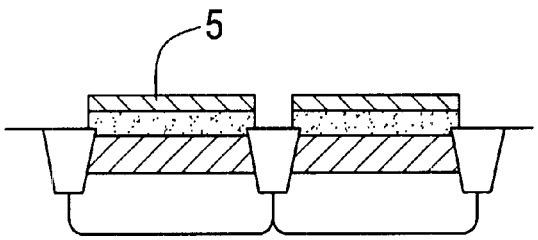
FIG. 9 is a cross-sectional diagram showing a structure formed in a steps of the multioxide manufacturing method according to the first preferred embodiment of the present invention.

Next, as shown in FIG. 9, nitriding the first gate oxide film 4 is performed to form an oxinitride film 5 in an upper region of the oxide film by plasma nitriding. As one example, a nitrogen molecular gas is introduced into a plasma generation device to cause nitrogen radicals and active nitrogen atoms. The radicals and atoms are supplied onto the wafer that is heated, to react with the silicon oxide film on the surface. For example, the wafer is heated to about 500° C., and a nitrogen gas of about 3 slm is supplied to make the plasma with power of about 5 KW. Then active nitrogen atoms made by the plasma are emitted for about 30 seconds, then the nitrogen is mixed with a part of the oxide film from its surface to about 1.0 nm to form an oxinitride film 5 on its surface. The surface nitrogen concentration at this time is about 10%. That is, two layers of a silicon oxide film and an oxide film including about 10% of nitrogen (oxinitride film) on the silicon oxide film are formed as a thick-film gate insulating film. Note that the surface nitrogen concentration depends on process conditions. Preferably, the lower limitation of the concentration is about 2% in consideration of etching resistance, and the upper limitation is about 50% in consideration of degradation of transistor characteristic.

Figure 10:
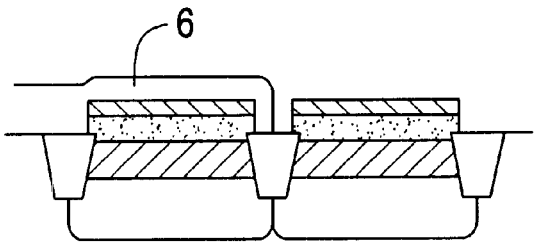
FIG. 10 is a cross-sectional diagram showing a structure formed in a steps of the multioxide manufacturing method according to the first preferred embodiment of the present invention.

Next, as shown in FIG. 10, a positive resist is coated, and selective exposure is performed using the mask, and a resist 6 is left only at the thick film region where a thick gate insulating film is to be formed after a development process. As discussed below, the resist 6 is used for removing selectively the gate insulating film at the thin film region where a thin gate insulating film is to be formed.

Figure 11:
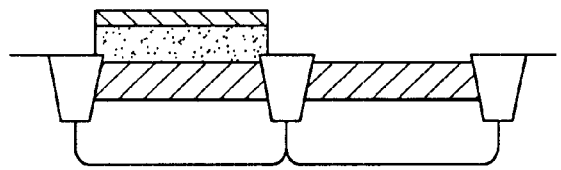
FIG. 11 is a cross-sectional diagram showing a structure formed in a steps of the multioxide manufacturing method according to the first preferred embodiment of the present invention.

As shown in FIG. 11, the gate insulating film that includes the gate oxide film 4 and the oxinitride layer 5 at the thin film region is removed, and the resist 6 acts as a mask, and is removed from the thick film region. As a solution of etching, a dilute hydrofluoric-acid solution may be preferable. The dilute hydrofluoric-acid solution is an etchant for the oxide film, and is also used as an etchant for the oxinitride film including about 10% nitrogen. Although the speed of etching of oxinitride film is considerably lower than that of a pure oxide film (i.e., about ¼ lower). For example, the speed of etching the natural oxide film 7 by a dilute hydrofluoric-acid solution, whose ratio of hydrofluoric-acid of 49% concentration to the pure water is about ¹⁄₁₀₀, is about 2.0 nm/min. However, the etching speed of the oxinitride film including about 10% of nitrogen is about 0.52 nm/min, and the gate insulating film 4,5 at the thick film region is thus not etched at all because of the resist 6 formed on it, and sufficient time is spent removing the gate insulating film 4,5 at the thin film region by etching. Thereafter, the resist 6 is stripped by e.g. aqueous sulfuric acid hydrogen peroxide.

Figure 12:
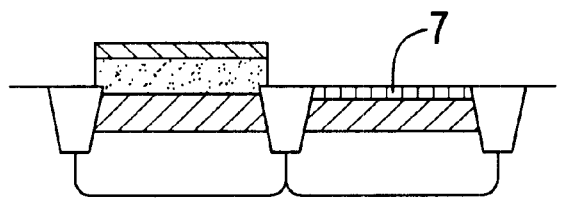
FIG. 12 is a cross-sectional diagram showing a structure formed in a steps of the multioxide manufacturing method according to the first preferred embodiment of the present invention.

Next, as shown in FIG. 12, a cleaning process is performed to clean the resist-contaminated surface of the gate insulating film at the thick film region and the silicon surface at the thin film region where the gate insulating film has been removed. For example, it is performed by cleaning using aqueous ammonia hydrogen peroxide and continuous cleaning using aqueous sulfuric acid hydrogen peroxide. At this time, these solutions slightly oxidize the silicon surface at the thin film region. The oxide film formed by the cleaning process is called a natural oxide film 7 or a chemical oxide film 7, as a low-concentration and a coarse oxide film in comparison with oxide films formed by a normal thermal oxidation. The film thickness of a natural oxide film is about 1.0 nm, which determines the cleaning solution ratio and/or treatment time.

Then, thermal oxidation is performed to form the gate oxide film. If a thick thermal oxide film is formed in thermal oxidation, the natural oxide film is reformed by the thermal atmosphere into an oxide film, providing excellent insulation. However, if a thin thermal oxide film is formed in thermal oxidation, the natural oxide film is not sufficiently reformed, the thermal oxide film includes a large amount of coarse natural oxide film, and reliability is remarkably degraded. Accordingly, in the first preferred embodiment of the present invention, the natural oxide film 7 is removed at the next step.

Figure 13:
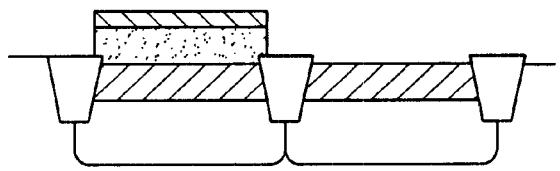
FIG. 13 is a cross-sectional diagram showing a structure formed in a steps of the multioxide manufacturing method according to the first preferred embodiment of the present invention.

As shown in FIG. 13, the natural oxide film 7 is removed by using the dilute hydrofluoric-acid solution. The dilution ratio may preferably be about 1:100 to 1:1000. The etching speed can be reduced by increasing the dilution ratio, in order to etch a natural oxide film 7 of merely about 1.0 nm with excellent control. For example, in case of an approximately 1:1000 dilution ratio, the etching speed is about 0.2 nm/min. By etching for 5 minutes+1 minute for margin= total 6 minutes, the natural oxide film 7 can be sufficiently removed.

The prevention against etching the gate oxide film at the thick film region at this process attains the effect of this embodiment of the present invention. As described above, 6 minutes etching is necessary to remove the natural oxide film 7. If the gate insulating film at the thick film region is a pure oxide film, the gate insulating film is etched to a maximum of about 1.2 nm to reduce the thickness of the gate insulating film at the thick film region. However, as an oxinitride film 5 with a low etching speed (i.e., about 0.052 nm/min) is formed on the gate oxide film, it is etched only about 0.3 nm and the gate oxide film is prevented from etching in this embodiment of the present invention. Further, the etching speed of the oxinitride film 5 can be reduced by enhancing the plasma nitriding condition to increase the content of nitrogen in oxinitride film, and etching by the dilute hydrofluoric-acid solution can be actually performed within a necessary period. Thus, the etching-caused nonuniformity can be avoided, and a wide margin of reproducibility can be provided since the etching of the gate insulating film at the thick film region can be suppressed. Further, the natural oxide film 7 at the thin film region has been completely removed at this time.

In addition, an another example of a method of removing the natural oxide film 7, RTH (rapid thermal hydrogen anneal) can be performed. In the method of RTH, the natural oxide film 7 is annealed under low-pressure in the atmosphere including hydrogen at the condition of 1 mTorr to 20 Torr in pressure, 700° C. to 1100° C. in temperature, 10 sec to 180 sec in time, 10 sccm to 10 slm in flow rate of 100% hydrogen gas, and at the preferable condition of about 1 Torr, about 3 slm of 100% hydrogen, about 95° C., and about 60 seconds. The natural oxide film 7 is then removed by using the oxinitride film 5 as a mask to prevent the thick gate insulating film 4 from being etched.

Further, as another embodiment, a vacuum annealing process can be performed to remove the natural oxide film 7. In the vacuum annealing process, the natural oxide film 7 is annealed under low pressure at the condition of 1E-9 Torr to 1 Torr, 750° C. to 1100° C., 10 sec to 180 sec and at the preferable condition of about 1 mTorr, about 1000° C., and about 60 seconds. The natural oxide film 7 is then removed by using the oxinitride film 5 as a mask to prevent the thick gate insulating film 4 from being etched.

Figure 14:
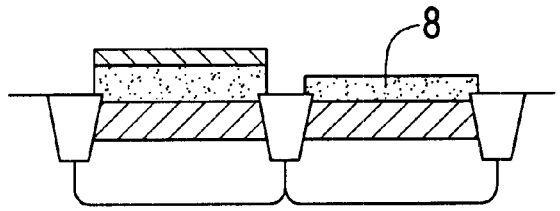
FIG. 14 is a cross-sectional diagram showing a structure formed in a steps of the multioxide manufacturing method according to the first preferred embodiment of the present invention.

Next, as shown in FIG. 14, an oxidation process is performed to form a thin second gate oxide film 8. There are various conditions for forming an oxide film with a thickness of about 2.0 nm or less. For example, the film 8 may be formed in a dry oxygen atmosphere at about 850° C. for about 12 seconds in a high-speed thermal processing device called an RTP (Rapid Thermal Processing). As another method, the film 8 may be formed in an atmosphere obtained by diluting oxygen with a large amount of nitrogen at 850° C. in a batch vertical diffusion furnace. As another method, a thin oxinitride film instead of the second gate oxide film 8 can be formed a by single nitride gas, such as either NO or $N_2O$, alone or in combination with dry oxygen or the like, in plural sequences. As another method of forming the thin second gate oxide film 8, a thin silicon oxide film is formed by Rapid Thermal Oxidation. Next, the thin silicon oxide film is reacted with nitrogen by a plasma nitriding process to form an oxinitride film, instead of the second gate oxide film 8. This method of plasma nitriding is similar to the method of plasma nitriding to form the oxinitride film 5. One of the above-described formation methods must be selected in accordance with the purpose of the transistors with a thin gate oxide film. For any of the methods, the film thickness of the gate insulating film 4,5 at the thick film region remains substantially unchanged, since the processing period for forming the insulating film 8 of about 2.0 nm or less is too short to increase the thickness of the already-formed thick oxide film 4,5 at the thick film region. Further, as the surface-nitrided oxinitride film 5 at the thick film region suppresses further diffusion of the oxidizing agent, reoxidation of the gate insulating film is suppressed, and that the thickness of the thick film region is not substantially changed from the early film thickness at FIG. 9.

Figure 15:
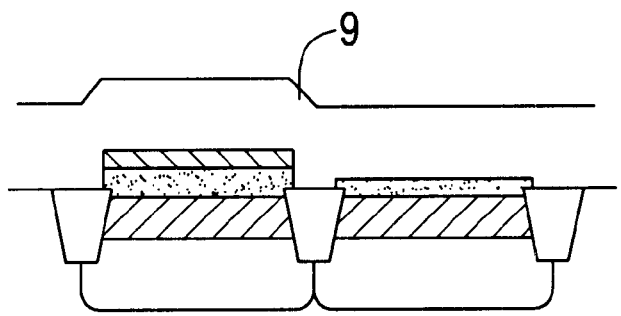
FIG. 15 is a cross-sectional diagram showing a structure formed in a steps of the multioxide manufacturing method according to the first preferred embodiment of the present invention.

Thereafter, an ordinary CMOS process is performed. First, as shown in FIG. 15, polysilicon 9 with a thickness of about 150 nm is deposited at about 620° C. under a reduced pressure.

Figure 16:
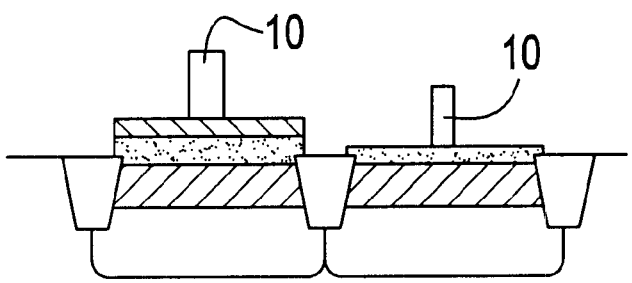
FIG. 16 is a cross-sectional diagram showing a structure formed in a steps of the multioxide manufacturing method according to the first preferred embodiment of the present invention.

Next, as shown in FIG. 16, the polysilicon is patterned to form an electrode 10 by a photolithography technique.

Figure 17:
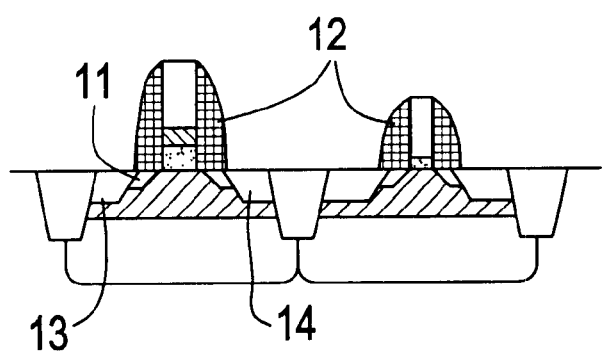
FIG. 17 is a cross-sectional diagram showing a structure formed in a steps of the multioxide manufacturing method according to the first preferred embodiment of the present invention.

Thereafter, as shown in FIG. 17, an LDD 11 (Lightly Doped Drain), a side wall 12, a source 13 and a drain 14 are formed. Then, an interlayer insulating film, contacts hole, then wiring are formed.

Note that while the plasma nitriding has been described as an example of nitriding the first gate oxide film 4, the nitriding is not limited to the plasma nitriding and any technique can be used, as long as the surface of the first gate oxide film can be nitrided. For example, the nitriding by NO gas may be used. Although primarily the surface of the silicon substrate is nitrided, the surface of the silicon film may also be nitrided. The first embodiment of the present invention requires that the etching speed of the oxinitride film is lower than the etching speed of the oxide film, and preferably, the highest degree of effect is attained when the surface nitrogen concentration of the oxinitride film is about 2% to about 50%.

In an alternative embodiment, a thin nitride film may be deposited on the oxide film instead of nitriding the oxide film to form the oxinitride film 5. A CVD nitride film with a thickness of about 2.0 nm is deposited by CVD using $SiH_4$ and $NH_3$. As an etchant in FIG. 11, a mixed solution of phosphoric acid, hydrofluoric acid, acetic acid and pure water is then applied to the deposited thin nitride film. Then, the oxide film is etched by dilute hydrofluoric acid. As the deposited nitride film provides remarkably higher resistance against the hydrofluoric acid than that provided by the oxinitride film, the advantages of the first preferred embodiment of the present invention can be sufficiently attained.

Further, the nitride film has been described above as an example, a non-nitride film may be employed, as long as it provides a higher resistance against hydrofluoric acid than the oxide film 7. For example, aluminum oxide (alumina: $Al_2O_3$) and tantalum oxide ($Ta_2O_5$), titanium oxide ($TiO_2$), a zirconium oxide film ($ZrO_2$), a hafnium oxide film ($HfO_2$) and the like are effective insulating films, and further, they have resistance against hydrofluoric acid. Accordingly, the effective of the invention can be realized by depositing these thin insulating films in place of the nitride film.

FIGS. 18 to 26 are cross-sectional views showing a method of manufacturing three types of gate insulating films, a thick gate insulating film, a thin gate insulating film, and a mid-thickness gate insulating film according to the second preferred embodiment of the present invention. Generally, a thick gate insulating film is formed in a peripheral circuit portion, high voltage (e.g., 5 V, 3.3 V) and high power requiring portions and an I/O portion. A thin gate insulating film is formed in a core transistor portion, a low voltage (e.g., 1.2 V) requiring portion and a high-speed operation requiring portion. A mid-thickness gate insulating film is formed in an SRAM portion, an intermediate voltage (e.g., 1.8 V) requiring portion and a High Vt requiring portion.

As shown in FIG. 18, a first gate oxide film 21 is formed on the silicon substrate 20. As shown in FIG. 19 a oxinitride layer 22 is formed on the surface of the first gate oxide film 21 in a similar way to the first preferred embodiment. A resist 23 is formed at a first region where a thick gate insulating film is to be formed, as shown on the left side of FIGS. 18–26.

As shown in FIG. 21, the gate oxide film 21 and the oxinitride layer 22 is removed by etching with the resist 23 as a mask. And then the resist 23 is stripped and cleaning and hydrofluoric-acid treatment is performed on the silicon surface at a second region where a mid-thickness gate insulating film is to be formed, as shown on the middle side of these figures, and at a third region where a thin gate insulating film is to be formed, as shown on the right side of these figures. Thus, the thick gate insulating film is formed.

As shown in FIG. 22, a second gate oxide film 24 is formed by thermal oxidation. And as shown in FIG. 23 a oxinitride layer 25 is formed on the surface of the gate oxide film 24 by similar way to the first preferred embodiment.

And then as shown in FIG. 24, a resist 26 is formed at the first region and the second region. As shown in FIG. 25, the gate oxide film 21 and the oxinitride layer 22 is removed by etching with the resist 23 as a mask. And then the resist 26 is stripped and cleaning and hydrofluoric-acid treatment is performed on the silicon surface at the third region. Thus, the mid-thickness gate insulating film is formed.

As shown in FIG. 26, a third gate oxide film 27 is formed by thermal oxidation. Thus, the tin gate insulating film is formed.

By repeating the above-described process of forming the gate oxide film to the process of performing cleaning and hydrofluoric-acid treatment on the silicon surface, plural gate oxide films having different film thickness are formed.

The present invention has various advantages, and overcomes the problems and disadvantages of the prior art. For example, as described above, according to these preferred embodiments of the present invention, the thick gate oxide film is not degraded by the stripping process, the cleaning process and the hydrofluoric-acid treatment process performed at the thin gate oxide film region, because the oxinitride film having a higher etching resistant than the thin gate oxide film is formed on the surface of the thick gate oxide film. Thus, precise film thickness control is realized.

Further, according to the present invention, the damage of the thick gate oxide film by these processes is reduced, and the reliability of the gate oxide film is improved because the oxinitride film 5, having a high etching resistance against the stripping process, the cleaning process and the HF preprocessing process, exists on the surface of the thick gate oxide film.

It is apparent that the present invention is not limited to the above embodiments, but may be modified and changed without departing from the scope and spirit of the invention.

What is claimed is:

1. A method of manufacturing a semiconductor device, comprising:

(a) forming a first film on a first region of a substrate;

(b) forming a second film on a second region of said substrate, wherein said first film is substantially resistant to etching during removal of a natural oxide film from said second region before forming said second film; and (c) forming a third film, which is thinner than said second film, on a third region of said substrate, wherein said third film is substantially resistant to etching during removal of a second natural oxide film on said third region of said substrate before forming said third film.

2. The method of manufacturing a semiconductor device as claimed in claim 1, further comprising:

(a) forming said first film on said second region and said third region;

(b) forming a first resist on said first film on said first region; and removing said first film from said second region and said third region by using said first resist as a mask for said first region.

3. The method of manufacturing a semiconductor device as claimed in claim 2, further comprising:

(a) removing said first resist from said first region; and (b) removing a first contamination from said first region that is caused by said first resist, and causes said first natural oxide film to form on said second region and said third region; and (c) removing said first natural oxide film by using said first film as a mask for said first region.

4. The method of manufacturing a semiconductor device as claimed in claim 2, said step (a) further comprising:

forming a first gate silicon oxide film in said first region, said second region and said third region; and forming a first cover layer on said first gate silicon oxide film.

5. The method of manufacturing a semiconductor device as claimed in claim 4, further comprising:
   (a) forming said second film on said third region,
   (b) forming a second cover layer on said second film in said third region,
   (c) forming a second resist on said first cover layer formed on said first region and a second cover layer formed on said second region;
   (d) removing second contamination caused by said second resist on said second cover layer to form a second oxide film on said third region; and
   (e) removing said second oxide film by using said first and said second cover layer as a mask for said first film and said third film, respectively.

6. The method of claim 5, wherein said removing said second contamination step comprises using aqueous ammonia hydrogen peroxide and aqueous sulfuric acid hydrogen peroxide, and substantially simultaneously cleans said second region, said first natural oxide film and said second natural oxide film are removed by using a hydrofluoric-acid having dilution ratio of 1:100 to 1:1000, said step (b) comprises forming the second film by thermal oxidation, and said first cover layer and said second cover layer comprises one of nitride, alumina and tantalum, titanium oxide, zirconium oxide and hafnium oxide.

7. A method of manufacturing a semiconductor device, comprising:
   forming a first film on a first region of a substrate, said first film comprising a first gate silicon oxide layer on said substrate and a cover layer on said first gate silicon oxide film; and
   forming a second film on a second region of said substrate after removing a natural oxide film on said second region by using a hydrofluoric-acid, wherein said cover layer is an oxinitride film performing as a mask for said first film during removing said natural oxide film.

8. The method as claimed in claim 7, wherein said forming said oxinitride film comprises:
   introducing gaseous nitrogen in to a plasma generation device to generate nitrogen radicals and active nitrogen atoms; and
   reacting said nitrogen radicals and said active nitrogen atoms with a silicon oxide to form said oxinitride film on said first gate silicon oxide layer.

9. The method as claimed in claim 7, wherein said forming said oxinitride film is performed by combining a nitride gas with a dry oxygen in plural sequences.

10. The method as claimed in claim 7, wherein said forming said second film comprises:
    forming a second gate silicon oxide layer by thermal oxidation.

11. The method as claimed in claim 7, wherein said forming said second film comprises:
    forming a second gate silicon oxide layer by diluting oxygen with a high concentration of nitrogen in a batch vertical diffusion furnace.

12. The method as claimed in claim 7, wherein said forming said second film comprises:

forming a silicon oxide film by a rapid thermal oxidation process; and
    forming an oxinitride film by reacting said silicon oxide film with nitrogen by plasma nitridation.

13. A method of manufacturing a semiconductor device, comprising:
    forming a first film on a first region of a substrate, said first film comprising a first gate silicon oxide layer on said substrate and a cover layer on said first gate silicon oxide film: and
    forming a second film on a second region of said substrate after removing a natural oxide film on said second region by using a hydrofluoric-acid, wherein said cover layer is a silicon nitride layer which is disposed on said first gate silicon oxide layer and performs as a mask for said first film during removing said natural oxide film.

14. A method of manufacturing a semiconductor device, comprising:
    forming a first film on a first region of a substrate, said first film comprising a first gate silicon oxide layer on said substrate and a cover layer on said first gate silicon oxide film; and
    forming a second film on a second region of said substrate after removing a natural oxide film on said second region by using a hydrofluoric-acid, wherein said cover layer is one material selected from the group consisting of $Al_2O_3$, $Ta_2O_5$, $TiO_2$, $ZrO_2$, and $HfO_2$ which is disposed on said first gate silicon oxide layer and performs as a mask for said first film during removing said natural oxide film.

15. The method as claimed in claim 7, wherein said hydrofluoric-acid has a dilution ratio of 1:100 to 1:1000.

16. The method as claimed in claim 7, further comprising:
    forming said first film on both said first region and said second region;
    forming a resist on said first film in said first region;
    removing said first film from said second region by using said resist as a mask;
    removing said resist from said first region;
    removing contamination from a surface of said first film, said contamination caused by said resist to provide said natural oxide film on said substrate on said second region.

17. The method as claimed in claim 7, wherein said natural oxide film is removed by a rapid thermal hydrogen annealing process.

18. The method as claimed in claim 7, wherein said natural oxide film is removed by a vacuum annealing process.

19. The method of manufacturing a semiconductor device as claimed in claim 7, further comprising:
    forming a polysilicon layer on said first film of said first region and on said second film of said second region; and
    patterning said polysilicon layer to form a first gate electrode on said first film and a second gate electrode on said second film.

* * * * *